United States Patent [19]
Van Buskirk et al.

[11] Patent Number: 5,882,416
[45] Date of Patent: Mar. 16, 1999

[54] LIQUID DELIVERY SYSTEM, HEATER APPARATUS FOR LIQUID DELIVERY SYSTEM, AND VAPORIZER

[75] Inventors: Peter C. Van Buskirk, Newtown; Steven M. Bilodeau, Oxford, both of Conn.; Ralph J. Carl, Jr., LaGrangeville, N.Y.

[73] Assignee: Advanced Technology Materials, Inc., Danbury, Conn.

[21] Appl. No.: 878,616

[22] Filed: Jun. 19, 1997

Related U.S. Application Data

[60] Provisional application No. 60/020,023 Jun. 12, 1996.

[51] Int. Cl.⁶ .............................. C23C 16/00; H05B 3/00; H05B 3/40
[52] U.S. Cl. ......................... 118/726; 118/724; 118/715; 261/154; 261/100; 261/104; 261/106; 261/107; 392/304; 392/487; 392/488; 392/489; 219/59.1; 219/539; 219/552; 432/225
[58] Field of Search ..................................... 118/724, 726, 118/715; 261/154, 100, 104, 106, 107, DIG. 65; 392/386, 388, 392, 394, 397, 396, 400, 401, 399, 398, 402, 301, 304, 487, 488, 489; 219/59.1, 67, 213, 385, 532, 539, 552; 432/225, 62, 90, 219

[56] References Cited

U.S. PATENT DOCUMENTS

| 476,274 | 6/1892 | Huck ....................................... 261/154 |
| 2,490,547 | 12/1949 | Schraner et al. ........................... 219/39 |
| 2,622,184 | 12/1952 | Johneas ..................................... 219/38 |

(List continued on next page.)

FOREIGN PATENT DOCUMENTS

| 0 058 571 | 8/1982 | European Pat. Off. . |
| 0 328 333 | 8/1989 | European Pat. Off. . |
| 370473 | 3/1923 | Germany . |

(List continued on next page.)

OTHER PUBLICATIONS

"Integrated Systems Approach Based on DLI," Bulletin LPDS–Dec. 1994, copyright 1994, MKS Instruments, Inc.

"Direct Liquid Injection Sub–System—DLI–25B," Bulletin DLI–Dec. 1994, copyright 1994, MKS Instruments, Inc.

Singh, R.K., et al., "In situ processing of eptiaxial Y–Ba–Cu–O high Tc superconducting films on (100) $SrTiO_3$ and (100) $YS-ZrO_2$ substrates at 500–650° C," App. Phys. Lett. 54(22), 29 May 1989, pp. 2271–2273.

(List continued on next page.)

*Primary Examiner*—R. Bruce Breneman
*Assistant Examiner*—Jeffrie R. Lund
*Attorney, Agent, or Firm*—Steven J. Hultquist; Oliver A. M. Zitzmann

[57] ABSTRACT

A liquid delivery system for delivery of an initially liquid reagent in vaporized form to a chemical vapor deposition reactor arranged in vapor-receiving relationship to the liquid delivery system. The liquid delivery system includes: (a) an elongate vaporization fluid flow passage defining a longitudinal axis and bounded by an enclosing wall to define a cross-section of the fluid flow passage transverse to the longitudinal axis; (b) a vaporization element contained within the fluid flow passage transverse to the longitudinal axis; a source reagent liquid feed passage having a terminus arranged to discharge liquid in a direction perpendicular to a facing surface of the vaporization element; (d) a heating means for heating the vaporization element to a temperature for vaporization of the liquid reagent; and (e) a manifold for flowing vapor formed by vaporization of the liquid reagent on the vaporization element from the fluid flow passage to the chemical vapor deposition reactor, in which the manifold including a diverting means to prevent non-volatile residue from flowing to the chemical vapor deposition reactor. A heater assembly may be employed for heating a component of the liquid delivery system, and the system may utilize a replaceable vaporizer cap removably engageable with the vaporization chamber.

38 Claims, 6 Drawing Sheets

U.S. PATENT DOCUMENTS

| | | | |
|---|---|---|---|
| 2,801,322 | 7/1957 | Wetherill | 219/39 |
| 2,925,329 | 2/1960 | Yost | 23/281 |
| 3,404,873 | 10/1968 | Orens | 261/141 |
| 3,520,416 | 7/1970 | Keedwell | 210/490 |
| 3,549,412 | 12/1970 | Frey, Jr. et al. | 117/100 |
| 3,659,402 | 5/1972 | Alliger | 55/233 |
| 3,823,926 | 7/1974 | Bracich | 261/106 |
| 3,943,330 | 3/1976 | Pollock et al. | 219/381 |
| 3,969,449 | 7/1976 | Shires et al. | 261/153 |
| 4,036,915 | 7/1977 | Lucero et al. | 261/104 |
| 4,288,396 | 9/1981 | Ottestad | 261/128 |
| 4,529,427 | 7/1985 | French | 65/3.12 |
| 4,673,122 | 6/1987 | Dubey | 228/119 |
| 4,842,893 | 6/1989 | Yializis et al. | 427/44 |
| 4,847,469 | 7/1989 | Hofmann et al. | 219/273 |
| 4,883,976 | 11/1989 | Loland | 92/86.5 |
| 5,034,372 | 7/1991 | Matsuno et al. | 505/1 |
| 5,097,800 | 3/1992 | Shaw et al. | 118/730 |
| 5,110,622 | 5/1992 | Hasegawa et al. | 427/126.1 |
| 5,120,703 | 6/1992 | Snyder et al. | 505/1 |
| 5,139,999 | 8/1992 | Gordon et al. | 505/1 |
| 5,165,960 | 11/1992 | Platts | 427/166 |
| 5,186,120 | 2/1993 | Ohnishi et al. | 118/667 |
| 5,204,314 | 4/1993 | Kirlin et al. | 505/1 |
| 5,225,561 | 7/1993 | Kirlin et al. | 546/256 |
| 5,259,995 | 11/1993 | Matalis | 261/107 |
| 5,362,328 | 11/1994 | Gardiner et al. | 118/726 |
| 5,376,409 | 12/1994 | Kaloyeros et al. | 427/248.1 |
| 5,434,388 | 7/1995 | Kralik et al. | 219/538 |
| 5,536,323 | 7/1996 | Kirlin et al. | 118/726 |
| 5,653,806 | 8/1997 | Van Buskirk | 118/715 |
| 5,711,816 | 1/1998 | Kirlin et al. | 118/726 |
| 5,741,363 | 4/1998 | Van Buskirk et al. | 118/715 |

FOREIGN PATENT DOCUMENTS

| | | |
|---|---|---|
| 58-125633 | 7/1983 | Japan . |
| 1305813 | 12/1986 | Japan . |

OTHER PUBLICATIONS

Yoshitake, T., et al., "As–grown superconducting Bi–Sr–Ca–Cu–O thin films by coevaporation," App. Phys. Lett. 55(7), 14 Aug. 1989, pp. 702–704.

Erbil, A., et al., "A Review of Metalorganic Chemical Vapor Deposition of High–Temperature Superconducting Thin Films," SPIE vol. 1187 Processing of Films for High Tc Superconducting Electronics (1989), 104–109.

Kirlin, Peter S., et al., "Growth of high Tc YBaCuO thin films by metalorganic chemical vapor deposition," SPIE vol. 1187 Processing of Films for High Tc Superconducting Electronics (1989), 115–127.

Zama, H., et al., "Properties of Metalorganic Precursors for Chemical Vapor Deposition of Oxide Superconductors," Japanese Journal of Applied Physics, 29(7), Jul. 1990, pp. L1072–L1074.

Gardiner, R., et al., "Volatile Barium β–Diketonate Polyether Adducts. Synthesis, Characterization, and Metallorganic Chemical vapor Deposition," Chem. Mater., 3(6), 1991, pp. 1053–1059.

Lackey, W.J., et al., "Rapid chemical vapor deposition of superconducting $YBa_2Cu_3O_x$," Appl. Phys. Lett. 56(12), 19 Mar. 1990, pp. 1175–1177.

Turnipseed, S.B., et al., "Synthesis and Characterization of Alkaline–Earth–Metal β–Diketonate Complexes Used as Precursors for Chemical Vapor Deposition of Thin–Film Superconductors," Inorg. Chem. 1991, 30(6), 1164–1170.

Hiskes, R., et al., "Single source metalorganic chemical vapor deposition of low microwave surface resistance $YBa_2Cu_3O_7$," Appl. Phys. Lett. 59(5), 29 Jul. 1991, pp. 606–607.

Zhang, J., et al., "Plasma Enhanced Metalorganic Chemical Vapor Deposition of Conductive Oxide Electrodes for Ferroelectric $BaTiO_3$ Capacitors," Mat. Res. Soc. Symp. Proc., vol. 310, 1993, pp. 249–254.

Van Buskirk, P., et al., "MOCVD Growth of $BaTiO_3$ in an 8" Single–Wafer CVD Reactor," Proceedings of ISAF92, in press (1992), 3 pages.

Zhang, J., et al., "Single liquid source plasma–enhanced metalorganic chemical vapor deposition of high quality $YBa_2Cu_3O_{7-x}$ thin films," Appl. Phys. Lett. 61(24), 14 Dec. 1992, pp. 2884–2886.

Panson, A.J., et al., "Chemical vapor deposition of $YBa_2Cu_3O_7$ using metalorganic chelate precursors," Appl. Phys. Lett. 53(18), 31 Oct. 1988, pp. 1756–1757.

Scarsbrook, G., et al., "Low temperature pulsed plasma deposition. Part I–a new technique for thin film dposition with complete gas dissociation," Vacuum, 38(8–10), 1988, pp. 627–631.

5,882,416

LIQUID DELIVERY SYSTEM, HEATER APPARATUS FOR LIQUID DELIVERY SYSTEM, AND VAPORIZER

U.S. GOVERNMENT RIGHTS

Work relating to the subject matter hereof was involved in the performance of Advanced Research Projects Administration (ARPA) Contract Number MDA-972-93-C-0033. The U.S. Government has certain rights in the invention hereof.

CROSS-REFERENCE TO RELATED APPLICATIONS

This application is based on and claims the priority of United States Provisional patent application Ser. No. 60/020,023 filed Jun. 19, 1996.

The disclosures of the following patent applications and patents are hereby incorporated herein by reference in their entirety: U.S. application Ser. No.: 08/484,025 filed Jun. 7, 1995 in the names of Peter S. Kirlin, et al.; in U.S. patent application Ser. No. 08/402,142 filed Mar. 10, 1995 in the name of Peter C. Van Buskirk; and U.S. application Ser. No. 08/621,088 filed Mar. 22, 1996 in the names of Peter C. Van Buskirk, et al.; International Patent Application No. PCT/US94/02512 filed Mar. 7, 1994 and designating therein the United States as a Designated State; U.S. application Ser. No. 08/280,143 filed Jul. 25, 1994; U.S. application Ser. No. 08/927,134 filed Aug. 7, 1992; U.S. Pat. No. 5,204,314; and U.S. application Ser. No. 07/549,389 filed Jul. 6, 1990.

BACKGROUND OF THE INVENTION

1. Field of the Invention

This invention relates to chemical vapor deposition systems and, more particularly, to liquid delivery systems, and to heaters and vaporizers for use in such systems.

2. Description of the Related Art

Many materials are utilized in the form of thin films on substrates and are formed by vapor deposition techniques. Examples include refractory materials such as high temperature superconducting (HTSC) materials including $YBa_2Cu_3O_x$, wherein x is from about 6 to 7.3, BiSrCaCuO, and TlBaCaCuO. Barium titanate, $BaTiO_3$, and barium strontium titanate, $Ba_xSr_{1-x}TiO_3$, have been identified as ferroelectric and photonic materials with unique and potentially very useful properties in thin film applications of such materials. $Ba_xSr_{1-x}Nb_2O_6$ is a photonic material whose index of refraction changes as a function of electric field and also as a function of the intensity of light upon it. Lead zirconate titanate, $PbZr_{1-x}Ti_xO_3$, is a ferroelectric material whose properties are very interesting. The Group II metal fluorides, $BaF_2$, $CaF_2$, and $SrF_2$, are useful for scintillation detecting and coating of optical fibers. Refractory oxides such as $Ta_2O_5$ are coming into expanded use in the microelectronics industry; $Ta_2O_5$ is envisioned as a thin-film capacitor material whose use may enable higher density memory devices to be fabricated.

Many of the potential applications of these materials require their use in thin film, coating, or layer form. The films or layers may also be advantageously epitaxially related to the substrate upon which they are formed. Applications in which the refractory materials may need to be deposited in film or layer form include integrated circuits, switches, radiation detectors, thin film capacitors, holographic storage media, and various other microelectronic devices.

Chemical vapor deposition (CVD) is a particularly attractive method for forming these layers because it is readily scaled up to production runs and because the electronic industry has a wide experience and an established equipment base in the use of CVD technology which can be applied to new CVD processes. In general, the control of key variables such as stoichiometry and film thickness, and the coating of a wide variety of substrate geometries is possible with CVD. Forming the thin films by CVD will permit the integration of these materials into existing device production technologies. CVD also permits the formation of layers of the refractory materials that are epitaxially related to substrates having close crystal structures.

CVD requires that the element source reagents, i.e., the precursor compounds and complexes containing the elements or components of interest must be sufficiently volatile to permit gas phase transport into the chemical vapor deposition reactor. The elemental component source reagent must decompose in the CVD reactor to deposit only the desired element at the desired growth temperatures. Premature gas phase reactions leading to particulate formation must not occur, nor should the source reagent decompose in the lines before reaching the reactor deposition chamber. When compounds are desired to be deposited, obtaining optimal properties requires close control of stoichiometry which can be achieved if the reagent can be delivered into the reactor in a controllable fashion. In this respect the reagents must not be so chemically stable that they are non-reactive in the deposition chamber.

Desirable CVD reagents therefore are fairly reactive and volatile. Unfortunately, for many of the refractive materials described above, volatile reagents do not exist. Many potentially highly useful refractory materials have in common that one or more of their components are elements, i.e., the Group II metals barium, calcium, or strontium, or the early transition metals zirconium or hafnium, for which no or few volatile compounds well-suited for CVD are known. In many cases, the source reagents are solids whose sublimation temperature may be very close to the decomposition temperature, in which case the reagent may begin to decompose in the lines before reaching the reactor, and it therefore is very difficult to control the stoichiometry of the deposited films from such decomposition—susceptible reagents.

In other cases, the CVD reagents are liquids, but their delivery into the CVD reactor in the vapor phase has proven impractical because of problems of premature decomposition or stoichiometry control. Examples include the deposition of tantalum oxide from the liquid source tantalum ethoxide and the deposition of titanium nitride from bis(dialkylamide)titanium reagents.

When the film being deposited by CVD is a multicomponent substance rather than a pure element, such as barium titanate or the oxide superconductors, controlling the stoichiometry of the film is critical to obtaining the desired film properties. In the deposition of such materials, which may form films with a wide range of stoichiometries, the controlled delivery of known proportions of the source reagents into the CVD reactor chamber is essential.

While source reagent liquid delivery systems present distinct advantages over conventional techniques, there is often some fraction of the precursor compound that decomposes into very low volatility compounds that remain at the vaporization zone. This deficiency is an important issue in the operation of CVD processes that use thermally unstable solid source precursors which undergo significant decomposition at conditions needed for sublimation. Such decomposition can occur in all reagent delivery systems that involve a vaporization step, including flash vaporizer liquid delivery systems as well as more conventional reagent delivery systems that include bubblers and heated vessels operated without carrier gas.

Although well-behaved CVD precursors vaporized under "ideal" conditions will form no deposits or residue at the vaporization zone, deviations from this situation are common and can be divided into several categories:

1) CVD precursors are employed which are thermally unstable at the sublimation temperature.
2) Reactive impurities in either the precursor or in the carrier gas decompose at the vaporizer temperatures.
3) Spatial and temporal temperature variations occur in the vaporization zone, with temperatures in some regions being sufficient to bring about decomposition.

Optimization of the conditions used in the vaporizer of reagent delivery systems can minimize the fraction of the delivered precursor that decomposes (and remains) at the vaporization zone, but virtually all solid and liquid precursors undergo some decomposition when they are heated for conversion to the gas phase. This fraction is negligibly small in "well-behaved" compounds. Use of precursors that tend to decompose near their vaporization temperature may be mandated by availability (i.e., where the selected precursor possesses the best properties of available choices) or by economics, where precursor cost is strongly dependent on the complexity of its synthesis.

Additionally, CVD precursors often contain impurities, and the presence of those impurities can cause undesirable thermally activated chemical reactions at the vaporization zone, also resulting in formation of involatile solids and liquids at that location. For example, a variety of CVD precursors (such as tantalum pentaethoxide) are water-sensitive and hydrolysis can occur at the heated vaporizer zone forming tantalum oxide particulates that may be incorporated into the growing tantalum oxide film with deleterious effects.

Despite the advantages of the liquid delivery approach (which include improved precision and accuracy for most liquid and solid CVD precursors and higher film growth rates), the foregoing deficiencies pose a serious impediment to widespread use of the vaporization liquid delivery technique for providing volatilized reagent to the CVD reactor.

A wide range of CVD processes currently under development utilize solid and liquid precursors. In many cases these chemicals are the only suitable choice in terms of gaseous transport of the element of interest, and this is especially characteristic of a number of metal elements such as Ba, Sr, La, etc. Ba, for example, is most easily transported in the vapor phase via incorporation in metalorganic compounds such as the beta-diketonates (e.g., $Ba(thd)_2$, $Ba(thd)_2$-tetraglyme, etc.) With such types of compounds, the temperature needed to sublime the material is often >200° C., and the sublimation or evaporation process is accompanied by decomposition of some fraction of the compound, which results in formation of other metalorganic complexes with reduced volatility. These decomposition by-products tend to remain in the vaporization zone, where they collect and serve to progressively diminish the efficiency of the vaporization process. With continued accumulation of decomposition products, and concomitant reduction of efficiency, the rate of decomposition will increase. The accretion of non-vapor byproduct decomposition products thus limits the operating life of the vaporizer. Such products buildup will eventually render the vaporizer and delivery system incapable of even minimal operating efficiency, thereby requiring the removal of the byproduct accumulation from the vaporization and delivery unit by cleaning processes. These maintenance procedures may be very labor- and time-intensive, or may even involve complete replacement of the vaporizer/delivery unit. Accordingly, the operating (on-line) service life of the vaporization/delivery unit may be substantially foreshortened, relative to a corresponding vaporization/delivery unit which does not experience such accumulation of decomposition non-volatile byproducts.

As an example of the foregoing problems, the chemical vapor deposition of barium strontium titanate results in precursor decomposition in the vaporizer chamber, producing an involatile liquid byproduct. When the vaporizer cools, the involatile liquid becomes a brown glass containing all three elements (barium, strontium and titanium). Some flows toward a trap, but some also remains on the vaporization element, typically a frit structure as described more fully in prior copending application No. 08/484,025 filed Jun. 7, 1995 in the names of Peter S. Kirlin, et al. The glassy residue remaining on the frit element decreases its conductance and progressively deteriorates the vaporization efficiency of the liquid delivery system.

It is therefore desirable for high efficiency operation of the liquid delivery system that the formation of non-volatile residue in the vaporization zone be minimized, that the tendency of the vaporizer to collect the non-volatile residue be minimized, and that suitable techniques, preferably in-situ techniques (interiorly applicable in the vaporization zone), be readily performable to remove the residue that does collect in the vaporization zone.

It is also desirable for the vaporizer component of the liquid delivery system to perform consistently, without perturbation or process variation, after the glassy residue has been removed in each maintenance cycle, relative to its performance preceding such maintenance. The vaporizer is also desirably easy to install and to maintain. Additionally, the liquid delivery system should be designed to readily detect leaks, to accommodate simple user operating support and maintenance procedures, and to be of a compact character, with a minimum of zones to heat in operation of the system.

Since the vaporizer must be heated to a temperature in excess of 200° C., with a high spatial uniformity of ±5° C., it is also desirable for the vaporizer heater to maintain the vaporization chamber and associated conduits within the same temperature window.

Accordingly, it is an object of the present invention to provide an improved delivery system for introduction of CVD source reagent precursors to CVD reactors.

It is another object of the invention to provide an improved liquid source reagent vaporization apparatus for a CVD process system which suppresses the formation of source reagent non-volatile decomposition byproducts and minimizes their passage to the CVD reactor.

It is a further object of the invention to provide an improved liquid delivery system comprising in-situ source reagent non-volatile decomposition byproduct removal and disposition means.

It is a further object of the invention to provide an improved vaporizer that is readily maintained, repaired and replaced, and that is compact and highly efficient in use.

Other objects and advantages of the present invention will be more fully apparent from the ensuing disclosure and appended claims.

SUMMARY OF THE INVENTION

The present invention relates to a liquid delivery system, as well as to subassemblies and components thereof, and the method of operation of same.

Various aspects of the invention, as hereafter more fully described, include the liquid delivery system, a heater assembly for such a liquid delivery system, and a replaceable vaporizer cap for a vaporization chamber of such a liquid delivery system.

In one aspect, the invention relates to a liquid delivery system for delivery of an initially liquid reagent in vaporized form to a chemical vapor deposition reactor arranged in vapor-receiving relationship to the liquid delivery system.

The liquid delivery system may for example include: (a) an elongate vaporization fluid flow passage defining a longitudinal axis and bounded by an enclosing wall to define a cross-section of the fluid flow passage transverse to the longitudinal axis; (b) a vaporization element contained within the fluid flow passage transverse to the longitudinal axis; (c) a source reagent liquid feed passage having a terminus arranged to discharge liquid in a direction perpendicular to a facing surface of the vaporization element; (d) a heating means for heating the vaporization element to a temperature for vaporization of the liquid reagent; and (e) a manifold discharging vapor, formed by vaporization of said liquid reagent on the vaporization element, from the fluid flow passage for passage to the chemical vapor deposition reactor, the manifold including a diverting means to prevent non-volatile residue from flowing to the chemical vapor deposition reactor.

In another aspect, the invention relates to a heater assembly having utilty for a liquid delivery system. Such heater assembly may include: (a) a heater body encasing a structural portion of the liquid delivery system; and (b) a heating element embedded in the heater body and heating the heater body to transfer thermal energy from the heater body to such structural portion of the liquid delivery system. The heater body may for example, and in a preferred embodiment, comprise a convection oven enclosing the vaporizer of the liquid delivery system.

Another aspect of the invention relates to a replaceable vaporizer cap for engaging a vaporization chamber in which vaporization of an initially liquid reagent may be carried out. Such vaporizer cap in one embodiment may include: (a) an elongate outer body defining a longitudinal axis and a cross-section transverse to the longitudinal axis; (b) a vaporization element positioned within the elongate outer body, such vaporization element having a facing surface oriented generally transverse to the longitudinal axis; (c) a capillary tube flowing the liquid reagent and arranged to discharge liquid reagent in a direction perpendicular to the facing surface of the vaporization element; (d) means for heating the vaporization element to a temperature for vaporization of said liquid reagent; and (e) means for removably engaging the outer body with the vaporization chamber.

In the liquid delivery system of the invention, the vaporizer may comprise a flow passage member containing a vaporization structure (vaporizer element), and defining a flow path through which vaporized source reagent, which may be either neat or augmented by a carrier gas flowed through such passage member, flows from the vaporization structure to the CVD reactor. The CVD reactor may be arranged with a substrate disposed therein, typically mounted on a heated susceptor or other support structure, and arranged in receiving relationship to the volatilized source reagent material, so that the vapor is decomposed to deposit one or more selected components, e.g., elemental metals, on the substrate.

In other aspects and embodiments, various features of the invention include the following:

1. A highly efficient structural configuration of the vaporization zone and process manifolds, and the provision of a process by-pass line and residue trap, which prevent undesired accumulation of non-volatile residue in the vaporization zone.
2. The provision of manifolds in the process system and process by-pass conduits, having fluid flow conductance characteristics which minimize formation of non-volatile residue in the vaporization zone.
3. The provision of means and method for removing the non-volatile residue that does collect in the vaporization zone.

The vaporizer assembly of the invention is constructed and arranged to minimize accumulation of residue at the vaporizer, and to prevent movement of residue towards the CVD process chamber. This may be achieved by disposing a process manifold at an inclined orientation in approach to the process chamber, or alternatively by use of structural barrier or diverting means, such as baffles, screens, moats, diverting tubes, etc., so that the residue thereby is manipulated to flow toward and into a residue trap.

The residue trap may be arranged to collect the non-volatile residue by gravity flow of the liquid and flowable solid residue into a suitable receptacle or other residue trap collection means. This residue trap may be coupled solely to the bypass part of the system manifold flow circuitry, or it may be shared with the exhaust from the CVD process chamber. Typically the manifold through which the metalorganic gases flow is heated to temperatures which discourage decomposition or condensation, and the first cold surface encountered is the cold trap of the system. The steep temperature gradient of the cold trap serves to localize collection of both gas phase precursors, and liquid-phase involatile decomposition byproducts that are formed at the vaporizer.

In addition to the above-described collection of non-volatile residue at the vaporizer of the liquid delivery system, pressure-flow characteristics that tend to minimize formation of residue are beneficially employed in the practice of the invention.

In general, high fluid flow conductance of the manifolds downstream of the vaporization zone is advantageous, especially when source reagents are being utilized for incorporation in the deposited film of elements such as Ba and Sr. Typical data presented below exemplify this dependence for chemical vapor deposition of illustrative $Ba_{0.70}Sr_{0.30}TiO_3$ (BST) thin films.

For purposes of the ensuing discussion, incorporation efficiency is defined as the number of moles of a particular element (e.g., barium) incorporated in a 6" diameter film formed in an illustrative standard deposition process, divided by the number of moles of the element introduced into the chemical vapor deposition reactor during the deposition process. This expression reflects both film thickness and composition, and is useful in assessing how particular process conditions influence the respective chemical vapor deposited film constituents.

Under otherwise constant process conditions for deposition of BST films, increasing the valve body size from a nominal ¼" to ¾" (outer) diameter tubing in the liquid delivery system manifold resulted in approximately a three-fold increase in the incorporation efficiency of the Ba and Sr species, while the incorporation efficiency of the Ti species remained constant. The valve body defines the region of largest fluid flow conductance drop in the liquid delivery system.

This increased efficiency of Ba and Sr incorporation was accompanied by reduction of Ba and Sr residue in the vaporization zone, and the operational longevity of the vaporizer (prior to the point of necessity of rebuilding, cleaning or replacing the vaporizer as a consequence of accumulation of the non-volatile decomposition byproducts of the vaporization of the precursors) is superior than in the case where lower conductance flow passages are employed in the system.

In another aspect of the invention, a cleaning medium which is removingly effective for the deposited decomposition byproduct material in the vaporizer is flowed through the vaporizer chamber for sufficient time and at sufficient process conditions (temperature and pressure) to effect a desired removal of the deposited material.

Thus, the invention contemplates an in situ cleaning method, in which the cleaning medium may for example comprise a liquid or other fluid which is solvatingly effective to remove the deposited decomposition byproduct material. This aspect of the invention most preferably is conducted at elevated process conditions as a hot solvent wash of the vaporization element and vaporization chamber interior surfaces, as well as of any additional flow circuit portions (such as conduit, valve and connector interior surfaces) which are susceptible to significant buildup of decomposition byproducts thereon.

The choice of the cleaning medium will of course depend on the type and number of source reagent species and their specific decomposition products and interactions with one another, as well as on the specific process conditions (temperatures, pressures, flow rates and compositions) involved. Examples of potentially usefully employed cleaning media ammonia, alkanols, glycols, ethers, hydrocarbon solvents, halocarbon solvents, etc. Preferred liquids include alkanolic solvents, tetraglyme, ammonia, and chlorinated hydrocarbon solvents.

Other aspects, features and embodiments of the invention will be more fully apparent from the ensuing disclosure and appended claims.

DETAILED DESCRIPTION OF THE INVENTION, AND PREFERRED EMBODIMENTS THEREOF

The disclosures of the following patent applications and patents are hereby incorporated herein by reference in their entirety: United States Provisional patent application Ser. No. 60/020,023 filed Jun. 19, 1996 in the names of Peter C. Van Buskirk, et al.; U.S. patent application Ser. No. 08/484,025 filed Jun. 7, 1995 in the names of Peter S. Kirlin, et al.; U.S. patent application Ser. No. 08/402,142 filed Mar. 10, 1995 in the name of Peter C. Van Buskirk; U.S. patent application Ser. No. 08/621,088 filed March 22, 1996 in the names of Peter C. Van Buskirk, et al.; International Patent Application No. PCT/US94/02512 filed Mar. 7, 1994 and designating therein the United States as a Designated State; U.S. patent application Ser. No. 08/280,143 filed Jul. 25, 1994; U.S. patent application Ser. No. 08/927,134 filed Aug. 7, 1992; U.S. Pat. No. 5,204,314; and U.S. patent application Ser. No. 07/549,389 filed Jul. 6, 1990.

Figure 1:
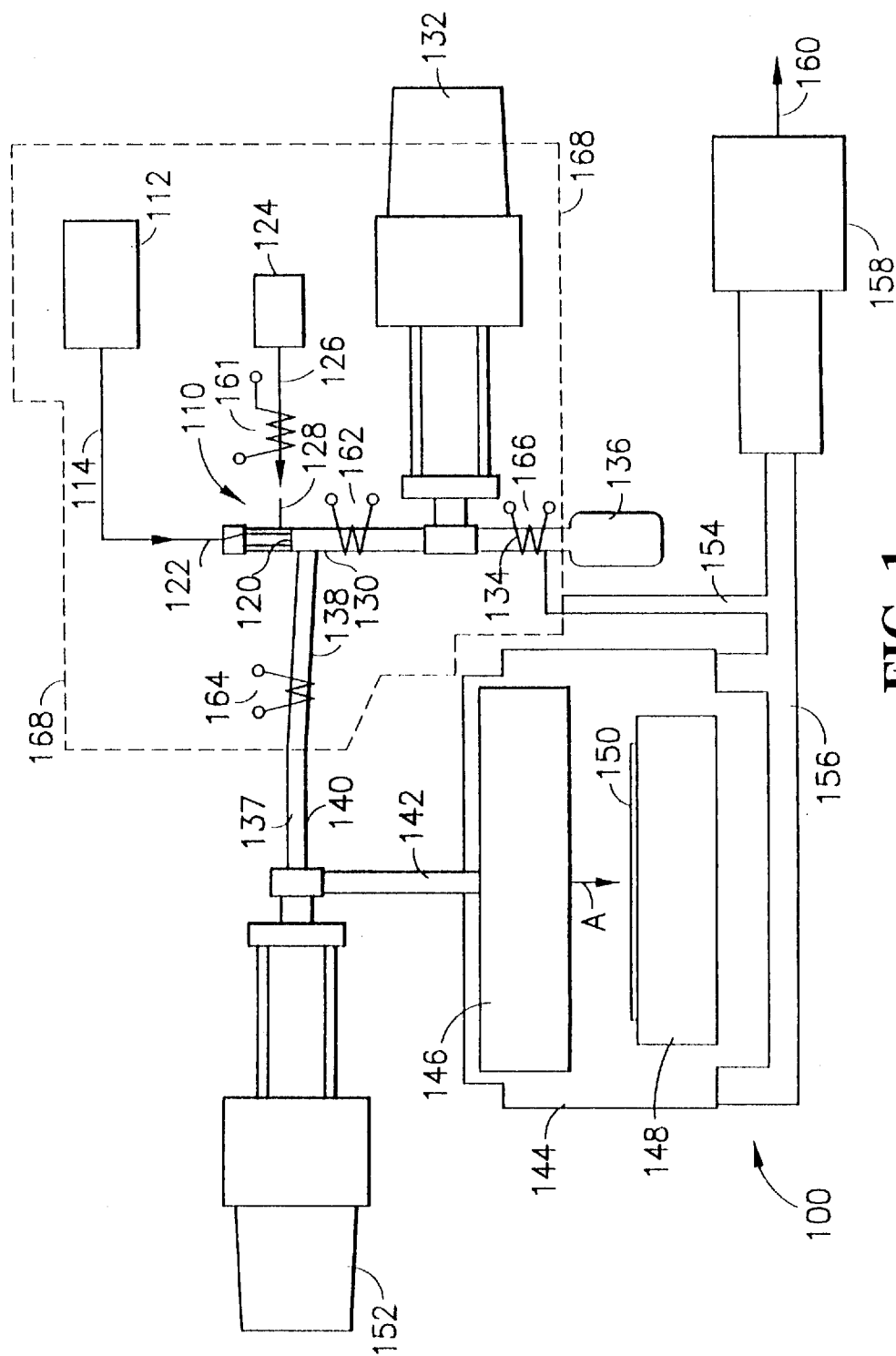
FIG. 1 is a schematic representation of a liquid delivery and chemical vapor deposition system, illustrating various features of the invention, in an illustrative embodiment thereof.

FIG. 1 is a schematic representation of a liquid delivery and chemical vapor deposition system, illustrating various features of the invention, in an illustrative embodiment thereof. The liquid delivery and chemical vapor deposition system 100 comprises a vaporization zone 110 including a vaporizer chamber 130 of elongate conformation. The vaporizer chamber 130 contains a vaporization frit element 120 fed by vertical flow conduit 122 with precursor source reagent from reagent supply vessel 112 connected to flow conduit 122 by supply line 114.

The vaporizer chamber 130 may also feature a carrier fluid inlet line 128 receiving carrier fluid such as argon, oxygen, or other carrier medium, from carrier fluid supply vessel 124 connected to inlet line 128 by supply line 126. This carrier fluid may be preheated to the vaporization temperature by means of a heater device. Preheating the carrier gas has been found to decrease particulate formation in the vaporization of $Ta(OEt)_5$ and to increase liquid flow capability in the vaporization of Cupra Select™ copper source reagent.

The vaporizer chamber 130 immediately downstream of the vaporization frit element 120 is coupled in flow communication with manifold conduit 137. The manifold conduit 137 comprises an upwardly inclined inlet portion 138 and a downstream horizontal portion 140.

The downstream horizontal portion 140 of manifold conduit 137 is joined by high conductance valve 152 to main feed conduit 142. The main feed conduit 142 in turn is joined in discharge relationship to showerhead disperser 146 in chemical vapor deposition process chamber 144, as shown. The showerhead disperser 146 may be constructed as more fully shown in U.S. patent application Ser. No. 08/402,142 and U.S. patent application Ser. No. 08/621,088, the disclosures of which are hereby incorporated herein in their entirety.

The showerhead disperser 146 is positioned in CVD chamber 144 in facing relationship to the susceptor 148 having wafer 150 thereon. The showerhead disperser 146 has a series of orifices on its front face (not shown) through which the volatilized source reagent vapor is passed in the direction indicated by arrow A, for impingement on the wafer surface to effect deposition of desired species thereon.

The CVD chamber 144 is joined to exhaust manifold 156 for discharge of vapor therefrom under the action of vacuum pump 158, for final discharge of the vapor to the exhaust line 160, and transfer to effluent treatment means and/or final disposition.

The lower end of vaporizer chamber 130 is joined by high conductance valve 132 to high conductance manifold bypass line 134 which drains liquid by gravity into the non-volatile residue trap 136 while passing the gas, depleted in non-volatile residue, in gas bypass line 154 to the aforementioned exhaust manifold 156.

The upwardly inclined inlet portion 138 of manifold conduit 137 thus serves to prevent non-volatile material from being passed by the manifold conduit 137 to the main feed inlet conduit 142 and thence into the CVD process chamber 144. Accordingly, any liquid or flowable solid decomposition product, deriving from decomposition of the source reagent components which have been vaporized by the vaporization element, are prevented by the upwardly inclined conduit from flow-through to the CVD chamber, and instead flow into the collection receptacle of the non-volatile residue trap 136.

The collection receptacle for the non-volatile residue may be sized and arranged to receive decomposition products from the vaporizer chamber for an extended period of time, whereby a cold trap receptacle may be a disposable part of the system, or alternatively such receptacle may be processed to remove the accumulated residue therefrom, followed by reinstallation and reuse of the receptacle in the system. The undecomposed reagent that has condensed in the cold trap may optionally be reclaimed and purified for use in the deposition process, to achieve high levels of reagent utilization.

The vaporization efficiency is favored by the use of high conductance flow conduits, manifolds and valves. Generally, relatively larger diameter flow passages are desired for the flow conduits in the system, preferably on the order of ½ to ¾ inch outer diameter, although it will be recognized that the size and conductance characteristics of the flow conduits may be widely varied in the broad practice of the present invention, as may the dimensions and conductance characteristics of the valves and manifolds employed in the practice of the invention. In one aspect and embodiment of the present invention, a manifold may be employed which is constructed of tubing and associated valves each having an inner diameter of from about 0.3 to about 3.0 inches, for high fluid flow conductance through the manifold.

Optimal dimensional and operating characteristics of the flow conduits, valves and manifolds may be readily determined in a specific application of the invention, by the simple expedient of varying the conductance of the valves and flow passages, and measuring the incorporation efficiency of the source reagent species and/or the amount of decomposition byproduct produced, and from such performance data selecting the appropriate components and their flow and dimensional characteristics.

As mentioned hereinearlier, in situ cleaning may be carried out by flowing a cleaning medium through the vaporizer chamber and in cleaning contact with the vaporizer element and interior surfaces thereof. This in-situ cleaning may be effected by providing a supply vessel of the cleaning medium, e.g., in alternative supply relationship to the supply line 114, as for example by a suitable valved manifold joined to the source reagent supply vessel 112 and cleaning medium supply vessel. By this arrangement, the feeding of source reagent to supply line 114 may be terminated and the feeding of cleaning medium may be initiated, and subsequently carried out for sufficient time and under sufficient process conditions to effect removal of the decomposition products from the vaporizer chamber, as well as from other interior surfaces of the piping, valves and manifolds of the system.

Such in-situ cleaning may for example comprise feeding of a liquid or other fluid cleaning medium through the vaporizer chamber in contact with the vaporization element therein. The cleaning medium may for example comprise ammonia, alkanols, glycols, ethers, hydrocarbon solvents, halocarbon solvents, etc. Preferred liquids include alkanolic solvents, tetraglyme, ammonia, and chlorinated hydrocarbon solvents.

An additional enhancement of the liquid delivery and CVD system 100 includes the use of electropolishing techniques for the interior walls of carrier fluid inlet line 128, vaporization chamber 130, manifold conduit 137, bypass line 134, and vertical flow conduit 122, wherein the inlet line 128, vaporization chamber 130, manifold conduit 137, bypass line 134, and vertical flow conduit 122 are preferably formed of a stainless steel material. A surface that is polished and passivated by electropolishing has a lower sticking coefficient for precursors and also inhibits condensation of reagent on the tubing walls. If the sticking coefficient of the tubing walls is reduced, there is less likelihood of material sticking to the hot walls of the tubing.

As an example of the salutory effects of electropolishing of internal surfaces of the system, after 3 months of operation, electropolished wall surfaces in an illustrative process system had no visible accumulation of material. Those lines not electropolished, however, had a thin, brown, powdery coating on the tubing walls. Electropolishing of the interior surfaces of carrier fluid inlet line 128, vaporization chamber 130, manifold conduit 137, bypass line 134, and vertical flow conduit 122 thereby is usefully employed to extend vaporizer lifetime by decreasing the formation of non-volatile species.

The liquid delivery and CVD system 100 may also be provided with vaporizer heating means, such as electrical resistance heaters, stream tracing lines, heating jackets, an encompassing convention oven, or other suitable heating means, by which the carrier fluid inlet line 128, vaporization chamber 130, manifold conduit 137, and high conductance manifold bypass line 134 are heated to prevent condensation of any vapor flowing therethrough. Vertical flow conduit 122 could also be heated by vaporizer heating means. Positioned proximate to carrier fluid inlet line 128 is a first vaporizer heating means 161. Positioned proximate to the vaporization chamber 130 is a second vaporizer heating means 162. Positioned proximate to the manifold conduit 137 is a third vaporizer heating means 164. Positioned proximate to the high conductance manifold bypass line 134 is a fourth vaporizer heating means 166.

For purposes of illustration, each vaporizer heating means will be referred to as heating coils, although each vaporizer heating means may comprise any of a wide variety of heating systems known to the skilled artisan for transferring thermal energy (to the internal passages of the carrier fluid inlet line 128, the vaporization chamber 130, the manifold conduit 137, and the high conductance manifold bypass line 134).

A thermal jacket 168 may also accommodate a length of carrier fluid inlet line 128, vaporization chamber 130, manifold conduit 137, high conductance manifold bypass line 134, residue trap 136, gas bypass line 154, and heating means 161, 162, and 166. The thermal jacket 168 provides insulating properties to the elements accommodated therein and cooperates with the vaporizer heating means to raise the internal temperature of conduit 137 and bypass line 134.

An alternative to thermal jacket 168 could be a vaporizer enclosed in an convention oven or other heating chamber. Oven side walls could define an enclosure or box surrounding the vaporizer. The oven would then be heated to prevent the condensation mentioned hereinearlier.

Figure 2A:
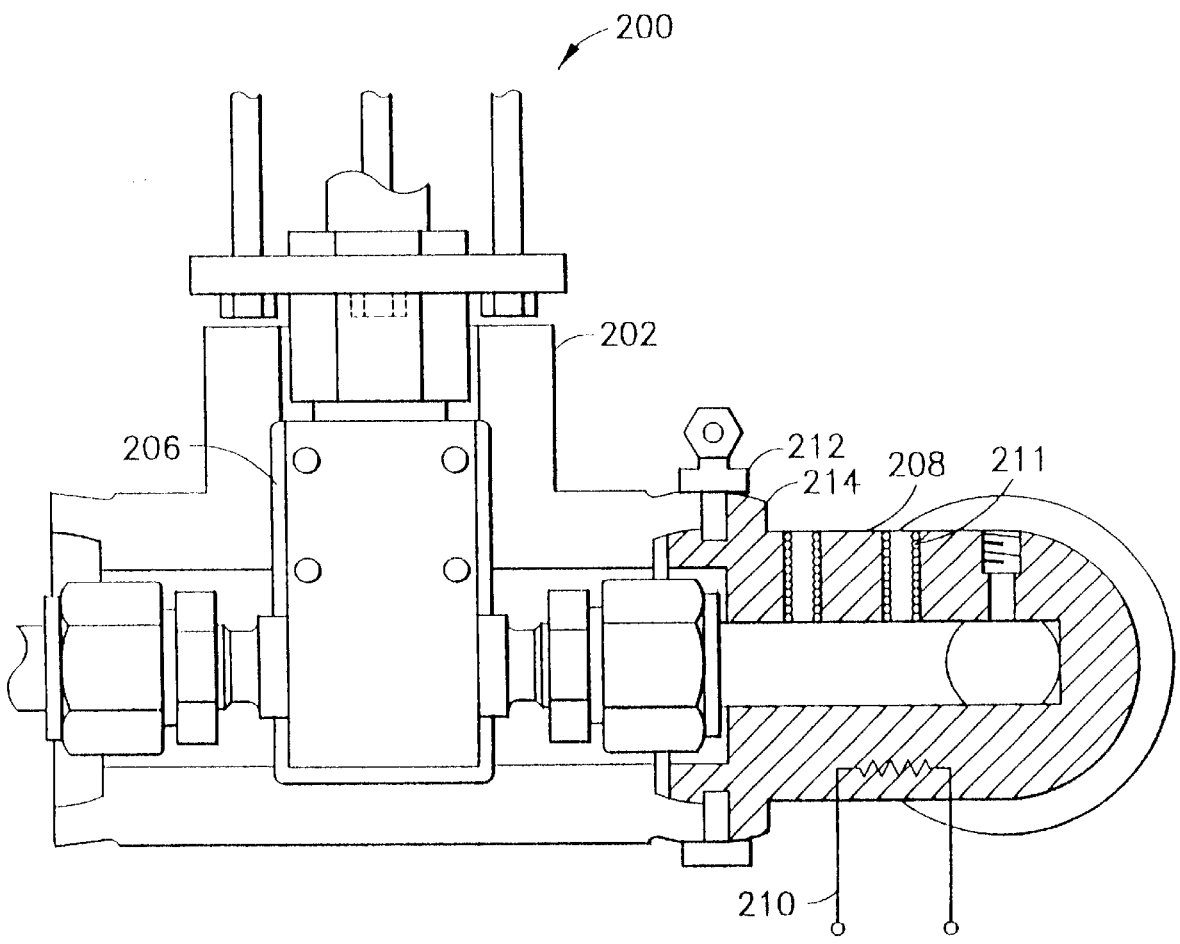
FIG. 2A is a portion of cross sectional view of a heater assembly usefully employed in a liquid delivery system, according to another aspect of the invention.
Figure 2B:
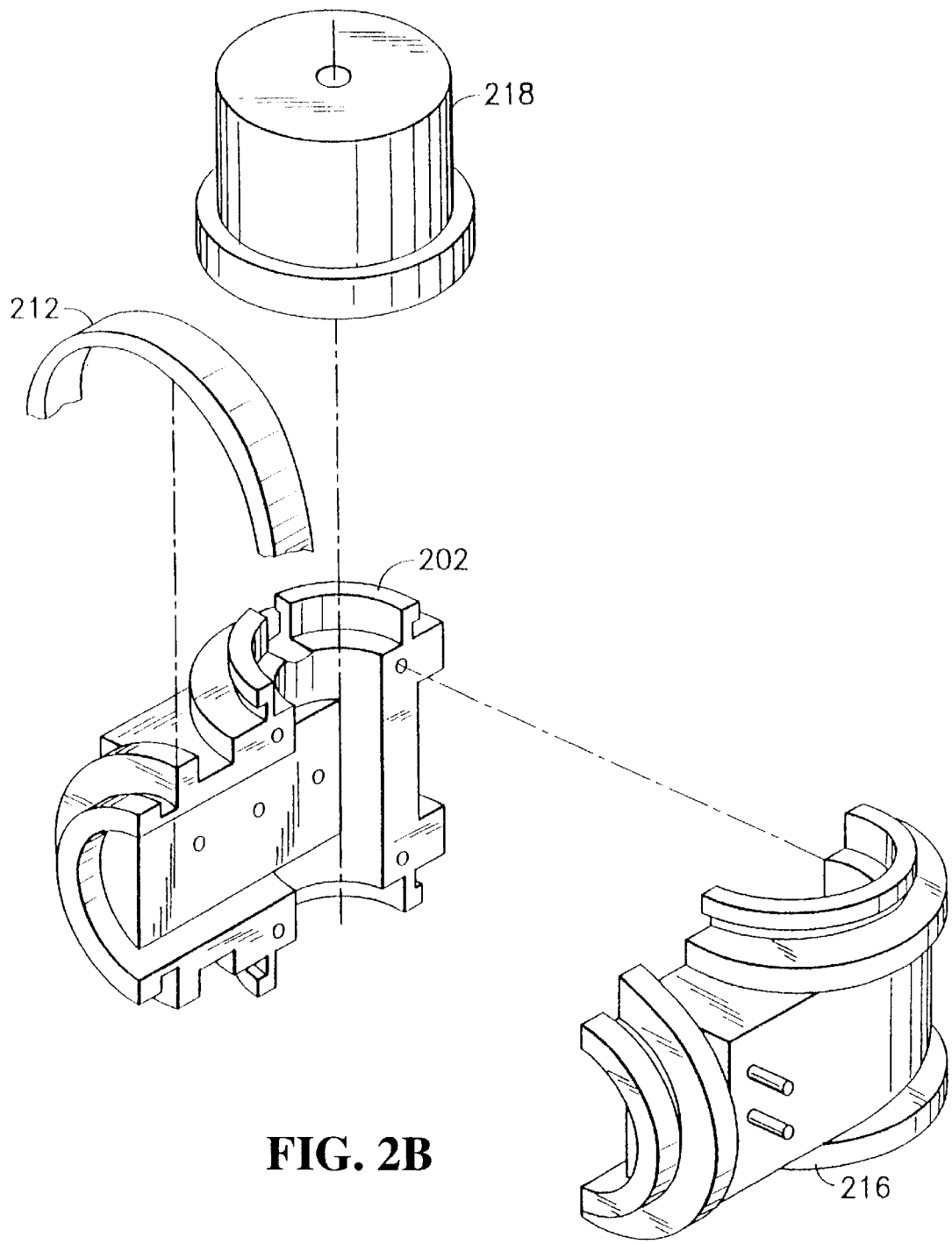
FIG. 2B is an exploded isometric view of a portion of FIG. 2A.

FIGS. 2A and 2B illustrate a particularly advantageous vaporizer heating means. The vaporizer heating means shown is a cast aluminum heater surrounding the conduits, vaporization chamber, bypass lines, or the valves of the vaporizer. Electrical resistance heating elements are embedded in each heater. Each heater is designed to create and maintain an isothermal operating condition surrounding the conduits, vaporization chamber and bypass lines of the vaporizer. This in turn provides an isothermal condition at all boundary surfaces of the conduits, vaporization chamber and bypass lines to which the reagent is exposed. Each aluminum heater incorporates a double spherical joint for good thermal contact between respective heaters. Since the desired isothermal operating condition is typically in the range of 200°–300° C., the cast aluminum heater of FIGS. 2A and 2B eliminates the heat lost at the junctions of more typical heating devices.

FIG. 2A is a portion of a cross-sectional view of cast aluminum heater assembly 200 used to heat a vaporization chamber (not shown). The heater assembly 200 includes a body comprising first and second body half-sections, with first body half-section 202 shown in this drawing. First body half-section 202 and second body half-section (not shown) encase valve 206 in a clam-shell arrangement. Valve 206 is one of two valves used to control the flow of vapor or fluids through the vaporizer apparatus and into a CVD reactor. Heater 208 includes at least one embedded heating element 210.

Clamp means, such as strap bands, hose clamps, welds, spring steel clips, adhesives, or threaded fasteners may be provided to clamp first and second body half-sections together. For the purposes of illustration, the clamp means hereafter described will be spherical hose clamp 212, although it is to be recognized that each clamp means may comprise any clamping system known to the skilled artisan for retaining sections of structural assemblies together as a conjoint or unitary structure.

Joint means, such as tab and keyway structures, threaded fasteners, clips, bands, or welds may be provided to join or couple first and second body halves with heater 208. For the purposes of illustration, the joint means will be described in reference to a ball and socket spherical joint 214, although it is to be recognized that each joint means may comprise any suitable joining elements, members or systems known to the skilled artisan, for securing heater 208 to the body halve-sections and transferring thermal energy to each body half-section.

FIG. 2B is an exploded isometric view of the body half-sections of FIG. 2A. First body half-section 202 and second body half-section 216 are shaped as shown in FIG. 2A and 2B. Spherical clamp 212 (only a portion of which is shown) secures body half-section. Cap 218 accommodates vertical flow conduit (not shown) for flowing precursor source reagent, and the cap, preferably constructed of aluminum or other suitable fabrication material, completes an enclosure of the vaporization chamber (not shown).

Although the heater assembly as described with reference to FIGS. 2A and 2B is used to maintain an isothermal condition for a vaporization chamber, the skilled artisan will recognize that the heater assembly may be easily adapted to other components of a liquid delivery system. Since the first and second heater half-sections are cast from aluminum, a mold could easily be fabricated to produce body half-sections for encasing the manifold, conduits, trap, or any other components of FIG. 1.

The heater assembly as described with reference to FIGS. 2A and 2B has several advantages. Since aluminum is a good thermal conductor, thermal gradients are easily prevented and a uniform temperature is easier to achieve. Aluminum is relatively inexpensive to cast into complicated shapes. Since the aluminum heater assembly surrounds the stainless steel components preferably employed, the stainless steel components are heated by a combination of radiation from the aluminum, by conduction at the locations where the stainless steel and aluminum contact, and by convection through the air gap between the aluminum body half-sections and the stainless steel components. The aluminum heater body is advantageously spring-loaded against the stainless steel vaporization tubing at suitable locations by "spring plungers" embedded in hole 211. By this arrangement of spring plungers, the aluminum jacket is forced into intimate thermal contact with the stainless steel conduit at these locations.

Figure 3:
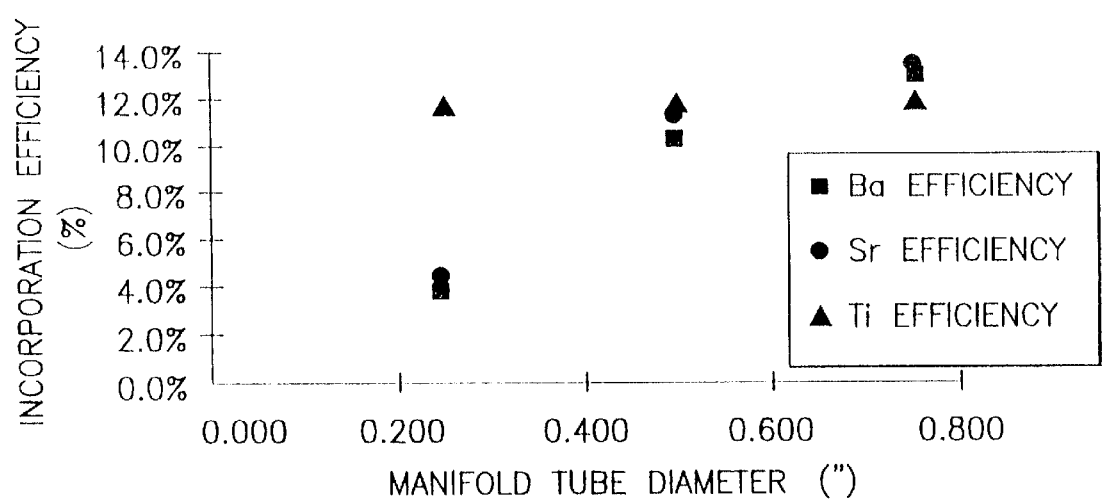
FIG. 3 is a graph of percent incorporation efficiency, of the liquid delivery and chemical vapor deposition system of FIG. 1, as a function of manifold tube diameter in inches.

FIG. 3 is a graph of percent incorporation efficiency as a function of manifold tube diameter in inches, showing the effect of conductance of flow passage means in the practice of the invention, for a system of the type schematically shown in FIG. 1. As mentioned, the conductance characteristics of flow passages in conduits, valves, and manifolds in the liquid delivery and vaporization system of the invention may be selectively varied to minimize the occurrence of decomposition of precursor source reagents in the vaporization step, and to maximize the incorporation efficiency of the deposited species in the film being formed on the substrate.

The incorporation efficiency data reflected in FIG. 3 were developed in a process system of the type schematically shown in FIG. 1, as used for chemical vapor deposition formation of illustrative $Ba_{0.70}Sr_{0.30}TiO_3$ (BST) thin films on 6" diameter wafers in the CVD chamber of the process system.

The process conditions for deposition of BST films were maintained constant in the respective tests, but the tubing diameter was varied in separate runs using ¼", ½", and ¾" outer diameter stainless steel tubing of standard wall thickness in the liquid delivery system manifold.

Data for the separate runs at each of the diameter values was plotted, yielding the graph shown in FIG. 3. As illustrated in this graph, the incorporation efficiency of barium and strontium in the liquid delivery vaporization and CVD process system was approximately 4% when the manifold tubing diameter was ¼", while the corresponding value for titanium incorporation efficiency was about 11.5%. With ½" diameter manifold tubing, the incorporation efficiency of barium increased to about 10.5% and the strontium incorporation efficiency increased to approximately 11%, while titanium incorporation efficiency remained at the same level as in the first run employing ¼" tubing. When ¾" manifold tubing was employed, the incorporation efficiency of barium and strontium increased to approximately 13% while the titanium incorporation efficiency remained on the same order of magnitude as in the first two runs.

Since increased efficiency of Ba and Sr incorporation in the process system is correlative of reduced generation and accumulation of decomposition byproduct material in the system, it is apparent that the increasing flow conductance of the manifold tubing in the test system provided an increased efficiency of system operation. As mentioned, optimal flow conductance characteristics of the conduits, valves and manifolds in the practice of the present invention may be readily determined by the expedient of flow conductance tests in varied conductance determination test systems within the skill of the art and without undue experimentation.

Selection of an appropriate frit pore size may also strikingly alter the conductance and vaporization characteristics of the frit vaporizer element. As an example, a 40 micron frit may be used to substantially enhance conductance, e.g., by a factor of two or more relative to previously used frit elements of smaller pore size. Since the pores of the 40 micron frit are larger than such previously used frit elements, the pores exhibit a longer time before clogging from accumulated non-volatile material. It is to be recognized that a larger pore size frit (e.g., a 40 micron pore size frit element) has less surface area available for wetting by the liquid reagent before vaporization than a frit with a smaller pore size (e.g., 10–20 micron pore size), and therefore a pore size which may be highly resistant to clogging and occlusion may be less efficient for wetting and vaporization. It will therefore be appreciated that the optimum pore size of a porous frit vaporizer element may be readily determined as the pore size accommodating the vaporizing and maintenance requirements of the overall system.

Figure 4:
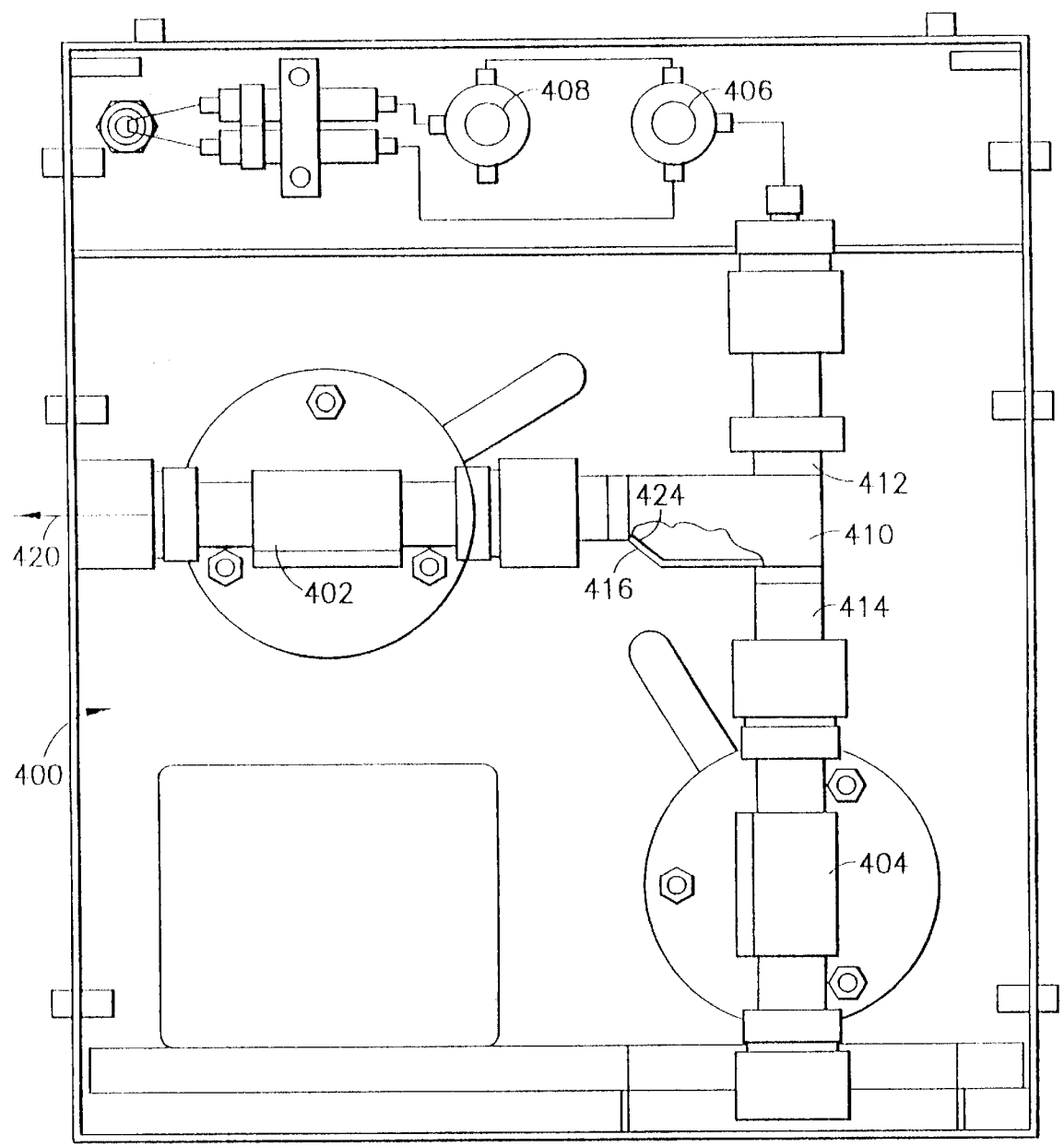
FIG. 4 is a schematic representation of a portion of another liquid delivery vaporization apparatus, which may be usefully employed in a liquid delivery and chemical vapor deposition system of the type shown in FIG. 1.

FIG. 4 shows a schematic representation of a portion of a liquid delivery vaporization system according to a further aspect of the invention. The liquid delivery vaporization system 400 shown in FIG. 4 comprises a flow circuit including valves 402, 404, 406 and 408 and associated piping. The piping includes vapor flow conduit 410 coupling conduits 412 and 414 therewith. A valve 402 is disposed in vapor flow conduit 410, which in turn is coupled to vapor feed conduit 420 for transport of the source reagent vapor to the chemical vapor deposition reactor (not shown).

In the FIG. 4 embodiment, the vapor flow conduit 410 comprises a sloped wall surface 416, forming a corresponding interior lip 424 as illustrated in the partially broken away view of vapor flow conduit 410. This interior lip structure thus serves as a dam or physical barrier means for preventing liquid from entering vapor feed conduit 420 and passing to the chemical vapor deposition reactor in operation of the overall system.

As an alternative to the specific lip structure shown in FIG. 4, it is apparent that other physical barrier structures could be employed in the broad practice of the present invention, as well as phase separation means, gas flow/liquid de-entrainment devices, and other means and methods to prevent the liquid and flowable solid decomposition products formed in the vaporizer chamber from passing to the CVD reactor where they could severely adversely affect the deposition operation and the viability of the product wafer structure.

Figure 5:
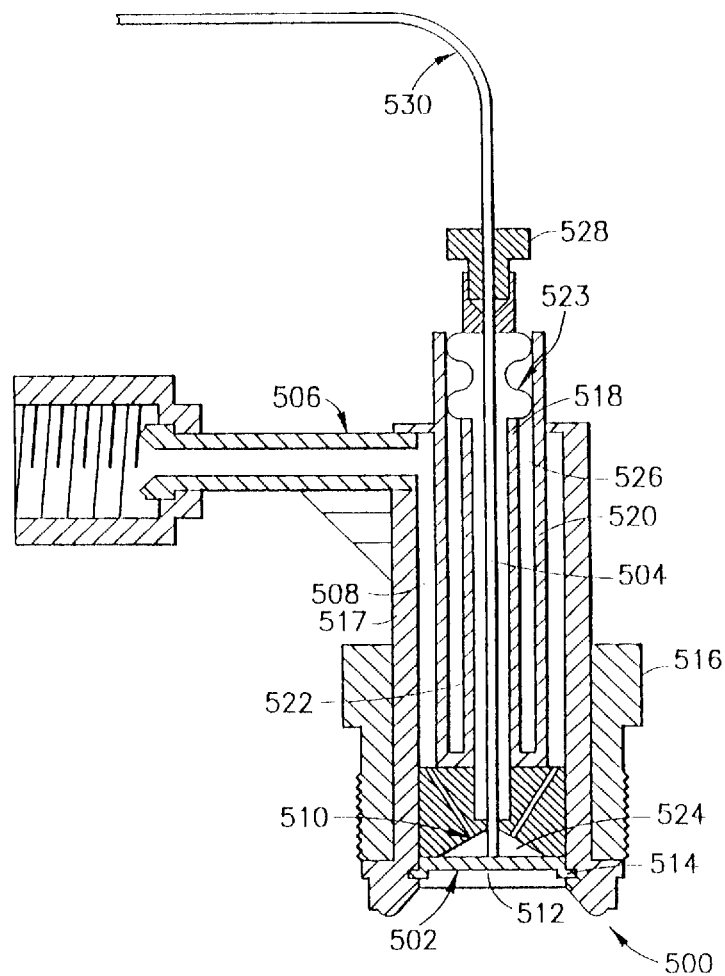
FIG. 5 is a cross sectional view of another vaporizer design according to a further embodiment of the invention.

FIG. 5 is a cross sectional view of another vaporizer design. This vaporizer design incorporates various vaporizer components into a single, replaceable, and compact vaporizer cap unit. The vaporizer cap unit 500 includes vaporization frit element 502 fed by capillary tube 504 flowing precursor source reagent from a suitable reagent supply (not shown).

Vaporizer cap unit 500 may also feature carrier gas delivery tube 506 receiving carrier gas from carrier fluid supply (not shown). Carrier gas passageway 508 is coupled in gas flow communication with carrier gas delivery tube 506 and flows carrier gas to carrier gas nozzle 510. Nozzle 510 induces turbulent flow in the carrier gas and restricts the flow of carrier gas in order to preheat carrier gas before injection into vaporization zone 512.

Vaporizer cap unit 500 may also include retaining means, such as snap ring, split ring, weld, locking tab, keyway, or press fit design by which the vaporization frit element 502 is retained in the vaporizer cap unit. For purposes of illustration, the retaining means will be described with reference to snap ring 514, although the retaining means may include any other suitable retaining means known to the skilled artisan, for fastening the frit 502 to vaporizer cap unit 500.

Vaporizer cap unit 500 includes an elongate outer body removably engageable with a vaporization chamber (not shown). The elongate outer body defines a longitudinal axis and a cross-section transverse to the longitudinal axis. The outer body includes engaging means, such as threads, snap rings, or tab and keyway by which the outer body is removably engaged in the vaporization chamber. For purposes of illustration, the engaging means will be described with reference to the male threaded portion 516, although the engaging means may include any other suitable engaging means known to the skilled artisan, for removably engaging the outer body to a vaporization chamber.

An outer wall 517 circumscribes first inner wall 518 and second inner wall 520. First inner wall 518 circumscribes capillary tube 504 to define a first gas flow passageway 522 therebetween. First gas flow passageway 522 is in fluid flow communication with bellows 523 and allows vacuum from the chemical vapor deposition reactor, e.g., as described in FIG. 1, to create a pressure differential in the bellows. Since the bellows 523 is subjected to a vacuum, the force of atmospheric pressure will compress the bellows and allow capillary tube outlet 524 to be appropriately positioned to frit 502. If the vaporizer is pressurized, bellows 523 is able to allow capillary tube outlet 524 to be raised from the frit to aid in removing clogs in the capillary tube. Nozzle 510 may also include a circumferential slot to consistently seat the capillary tube 504. The first inner wall 518 also acts to guide capillary tube 504 into vaporization cap unit 500.

Second inner wall 520 circumscribes first inner wall 518 to define a thermal isolation chamber 526. First gas flow passageway 522 and thermal isolation chamber 526 cooperate to provide thermal isolation for capillary tube 504. Since the capillary tube 504 is in close proximity to heated frit 502, passageway 522 and isolation chamber 526 cooperate to maintain the temperature of capillary tube 504 below 200° C.

A zero dead volume compression fitting 528 at an upper end of capillary tube 504 removably engages with liquid precursor delivery tube 530 employed for flowing precursor source reagent from a reagent supply (not shown). Bellows 523 is attached between compression fitting 528 and second inner wall 520 to form a gas-tight seal therebetween.

An optional additional enhancement of the vaporizer cap unit 300 may include, as discussed hereinearlier, the use of electropolishing techniques to yield a passivated surface with a lower sticking coefficient for the precursors and to inhibit condensation of reagent on the interior walls and reduce the likelihood of material sticking to the hot walls. Electropolishing the interior surfaces of capillary tube 304, first inner wall 518, carrier gas delivery tube 506, passageway 522, and each surface of second inner wall 520 enhances vaporizer lifetime by decreasing the formation of non-volatile species.

The vaporizer cap unit 500 may also be embodied with other features which improve the functionality and lifetime of the vaporizer. The bellows and the annular reservoirs provide thermal isolation between the hot vaporizer body and the capillary tube 504. The thermal isolation provided by bellows 523 and annular reservoirs 522 and 526 keeps the capillary tube 504 cool. If the capillary tube is also used to flow cleaning medium for in-situ cleaning, as discussed hereinearlier, a cooler capillary tube also helps prevent solid precursor deposits, by minimizing premature boiling of the cleaning medium.

The nozzle 510 concentrates hot gases and improves vaporization. The nozzle concentrates heated gas flow to the point where the liquid precursor is discharged from capillary tube outlet 524. Since the primary mode of heat transfer to the frit 504 is from the carrier gas, concentrating the hot carrier gas in this capillary tube outlet zone will significantly improve vaporization.

The vaporizer cap unit 500 may also advantageously be constructed of commercially available components. Male threaded portion 516, first inner wall 518, and second inner wall 520 may advantageously be respectively constructed of a ¾ inch male VCR weld fitting, a ½ inch stainless steel tube, and a ¾ inch stainless steel tube. Bellows 523 may be constructed of a short length of ¼ inch thick-walled bellows material. The zero dead volume compression fitting 528 may be a ¼ inch VCR weld fitting.

The vaporizer cap unit 500 embodies an improved vaporizer design which is highly manufacturable and readily utilized. Such unit can be easily integrated with existing CVD installations. The vaporizer cap unit 500 also affords the ability to increase wafer throughput and decrease vaporizer downtime in operation of the liquid delivery system and associated vapor deposition reactor.

It will be appreciated that the liquid delivery system and associated means and structure may be formed of any suitable materials of construction that are advantageous in the manufacture, assembly, operation and maintenance thereof.

Although the invention has been illustratively described herein in reference to various features, aspects and embodiments, it will be recognized that the form, construction and operation of the liquid delivery vaporization and vapor deposition system may be widely varied in the broad practice of the present invention, and that variations, modifications and other embodiments are contemplated, within the spirit and scope of the invention as herein disclosed.

What is claimed is:

1. A liquid delivery system for delivery of an initially liquid reagent in vaporized form to a chemical vapor deposition reactor arranged in vapor-receiving relationship to the liquid delivery system, said liquid delivery system comprising:
    (a) an elongate vaporization fluid flow passage defining a longitudinal axis and bounded by an enclosing wall to define a cross-section of the fluid flow passage transverse to the longitudinal axis;
    (b) a vaporization element with a facing surface oriented in the fluid flow passage generally transverse to the longitudinal axis;
    (c) a source reagent liquid feed passage having a terminus arranged to discharge liquid in a direction perpendicular to the facing surface of the vaporization element;
    (d) a heating means for heating the vaporization element to a temperature for vaporization of said liquid reagent; and
    (e) a manifold for flowing vapor formed by vaporization of said liquid reagent on the vaporization element, from the fluid flow passage to the chemical vapor deposition reactor, the manifold including a diverting means to prevent non-volatile residue formed in the vaporization of the liquid reagent from flowing to the chemical vapor deposition reactor.

2. A liquid delivery system according to claim 1, wherein the diverting means comprises a surface of the manifold arranged at an upwardly inclined orientation to the fluid flow passage longitudinal axis to prevent non-volatile residue from flowing to the chemical vapor deposition reactor.

3. A liquid delivery system according to claim 1, wherein the fluid flow passage longitudinal axis is vertical.

4. A liquid delivery system according to claim 1, further comprising a residue trap collection means coupled in fluid flow communication with the fluid flow passage, with the residue trap collection means arranged to collect non-volatile residue.

5. A liquid delivery system according to claim 4, wherein the residue trap collection means is arranged to collect non-volatile residue by gravity flow of the non-volatile residue into the residue trap collection means.

6. A liquid delivery system according to claim 4, wherein the residue trap collection means includes a disposable receptacle.

7. A liquid delivery system according to claim 4, wherein the residue trap collection means includes a reusable receptacle.

8. A liquid delivery system according to claim 4, wherein the residue trap collection means is constructed of stainless steel material.

9. A liquid delivery system according to claim 8, wherein the stainless steel residue trap collection means has an electropolished interior surface to inhibit condensation on and sticking of non-volatile residue to the interior surface.

10. A liquid delivery system according to claim 1, wherein the elongate fluid flow passage, source reagent liquid feed passage, and manifold are constructed of stainless steel material.

11. A liquid delivery system according to claim 10, wherein the stainless steel elongate fluid flow passage, the stainless steel source reagent liquid feed passage, and the stainless steel manifold each have an electropolished interior surface to inhibit condensation on and sticking of non-volatile residue to the interior surface.

12. A liquid delivery system according to claim 10, wherein the manifold is constructed of tubing and associated valves each having an inner diameter of from about 0.3 to about 3.0 inches, for high fluid flow conductance through the manifold.

13. A liquid delivery system according to claim 1, further comprising vaporizer heating means for heating the elongate fluid flow passage.

14. A liquid delivery system according to claim 1, further comprising vaporizer heating means for heating the source reagent liquid feed passage.

15. A liquid delivery system according to claim 1, further comprising vaporizer heating means for heating the manifold.

16. A liquid delivery system according to claim 1, further comprising a carrier fluid inlet line in fluid flow communication with the elongate fluid flow passage for flowing carrier fluid for pick-up of vaporized liquid reagent.

17. A liquid delivery system according to claim 16, wherein the carrier fluid inlet line is constructed of stainless steel material.

18. A liquid delivery system according to claim 17, wherein the carrier fluid inlet line has an electropolished interior surface to inhibit condensation and sticking of non-volatile residue to the interior surface.

19. A liquid delivery system according to claim 16, further comprising vaporizer heating means for heating the carrier fluid inlet line.

20. A heater assembly for heating a structural portion of a liquid delivery system arranged for delivering an initially liquid reagent in vaporized form to a chemical vapor deposition reactor arranged in vapor-receiving relationship to the liquid delivery system comprising:
    (a) a heater body encasing the structural portion;
    (b) a heating element embedded in the heater body and heating the heater body to transfer thermal energy from the heater body to said structural portion;

wherein said liquid delivery system comprises:
  (c) an elongate vaporization fluid flow passage;
  (d) a vaporization element in the fluid flow passage;
  (e) a source reagent liquid feed passage for delivering source reagent liquid to the vaporization element;
  (f) means for heating the vaporization element to a temperature for vaporization of said liquid reagent; and
  (g) means for flowing vapor formed by vaporization of said liquid reagent on the vaporization element, from the fluid flow passage to the chemical vapor deposition reactor.

21. A heater assembly according to claim 20, wherein the heater body encasing the structural portion comprises a convection oven.

22. A heater assembly according to claim 21, wherein the heater body comprises a first heater body half-section and a second heater body half-section and each heater body half-section is cast from aluminum.

23. A heater assembly according to claim 21, further comprising a clamp means to clamp first and second body half-sections together to encase the structural portion.

24. A heater assembly according to claim 23, wherein the clamp means comprises a spherical hose clamp.

25. A replaceable vaporizer cap removably engageable with a vaporization chamber for vaporizing an initially liquid reagent, comprising:
  (a) an elongate outer body defining a longitudinal axis and a cross-section transverse to the longitudinal axis;
  (b) a vaporization element positioned in the elongate outer body and having a facing surface transverse to the longitudinal axis;
  (c) a capillary tube flowing the liquid reagent and arranged to discharge liquid reagent in a direction perpendicular to the facing surface of the vaporization element;
  (d) a heating means for heating the vaporization element to a temperature for vaporization of said liquid reagent; and
  (e) engaging means for removably engaging the outer body to the vaporization chamber.

26. A replaceable vaporizer cap according to claim 25, wherein the engaging means comprises an outer body threaded portion to threadably engage the vaporization chamber.

27. A replaceable vaporizer cap according to claim 25, further comprising a retaining means for retaining the vaporization element in the vaporizer cap.

28. A replaceable vaporizer cap according to claim 27, wherein the retaining means comprises a snap ring for retaining the vaporization element in the vaporizer cap.

29. A replaceable vaporizer cap according to claim 25, further comprising:
  (a) an inner wall within the outer body, the inner wall circumscribing said capillary tube and defining therebetween a gas flow passageway, said gas flow passageway in gas flow communication with the vaporization chamber;
  (b) a compression fitting attached to an upper end of the capillary tube;
  (c) a bellows component attached between an upper end of said inner wall and the compression fitting, the bellows component in gas flow communication with said gas flow passageway such that any pressure differential between the vaporization chamber and atmospheric pressure will (i) cause the capillary tube to seat against the vaporization element when the pressure in the vaporization chamber is less than atmospheric pressure, or (ii) cause the capillary tube to lift from the vaporization element when the pressure in the vaporization chamber is greater than atmospheric pressure.

30. A replaceable vaporizer cap according to claim 25, further comprising:
  (a) a carrier gas delivery tube;
  (b) the outer body circumscribing an inner wall and defining therebetween a carrier gas passageway in gas flow communication with the carrier gas delivery tube, with the inner wall circumscribing the capillary tube and defining therebetween a thermal isolation reservoir.

31. A replaceable vaporizer cap according to claim 30, further comprising a carrier gas nozzle in gas flow communication with the carrier gas passageway, the nozzle inducing turbulent flow in the carrier gas prior to discharge at the vaporization element.

32. A replaceable vaporizer cap removably engageable with a vaporization chamber for vaporizing an initially liquid reagent, comprising:
  (a) an elongate outer body defining a longitudinal axis and a cross-section transverse to the longitudinal axis;
  (b) a vaporization element positioned in the elongate outer body with a facing surface oriented generally transverse to the longitudinal axis;
  (c) a capillary tube for flowing the liquid reagent and arranged to discharge liquid reagent in a direction perpendicular to the facing surface of the vaporization element;
  (d) a heating means for heating the vaporization element to a temperature for vaporization of said liquid reagent;
  (e) engaging means for removably engaging the outer body with the vaporization chamber;
  (f) a first inner wall within the outer body, the first inner wall circumscribing said capillary tube and defining therebetween a gas flow passageway, said gas flow passageway being in gas flow communication with the vaporization chamber;
  (g) a compression fitting attached to an upper end of the capillary tube;
  (h) a bellows component attached between an upper end of said first inner wall and the compression fitting, with the bellows component being in gas flow communication with said gas flow passageway such that any pressure differential between the vaporization chamber and atmospheric pressure will (i) cause the capillary tube to seat against the vaporization element when the pressure in the vaporization chamber is less than atmospheric pressure, or (ii) cause the capillary tube to lift from the vaporization element when the pressure in the vaporization chamber is greater than atmospheric pressure;
  (i) a carrier gas delivery tube;
  (k) the outer body circumscribing a second inner wall and defining therebetween a carrier gas passageway in gas flow communication with the carrier gas delivery tube, the second inner wall circumscribing the first inner wall and defining therebetween a thermal isolation reservoir;
  (l) a carrier gas nozzle in gas flow communication with the carrier gas passageway, the nozzle inducing turbulent flow in the carrier gas prior to discharge at the vaporization element.

33. A replaceable vaporizer cap according to claim 32, wherein the engaging means comprises an outer body threaded portion to threadably engage the vaporization chamber.

34. A replaceable vaporizer cap according to claim 32, further comprising a retaining means for retaining the vaporization element in the vaporizer cap.

35. A replaceable vaporizer cap according to claim 34, wherein the retaining means comprises a snap ring for retaining the vaporization element in the vaporizer cap.

36. A replaceable vaporizer cap according to claim 34, comprising an electropolished interior surface.

37. A replaceable vaporizer cap according to claim 34, wherein the first inner wall has an electropolished interior surface.

38. A replaceable vaporizer cap according to claim 34, wherein all interior surfaces exposed to vaporized reagent are electroplated.

* * * * *

UNITED STATES PATENT AND TRADEMARK OFFICE
CERTIFICATE OF CORRECTION

PATENT NO. : 5,882,416
DATED : March 16, 1999
INVENTOR(S) : Van Buskirk et al.

It is certified that error appears in the above-indentified patent and that said Letters Patent is hereby corrected as shown below:

Title page, item [60]: Provisional Application: "Jun. 12," should be -- Jun.19, --

U.S. Patents cited:    "4,883,976...Loland" should be --4,833,976...Loland --

Column 9, line 51:    "manifoldjoined" should be -- manifold joined --

Column 17, line 20:    "claim 21" should be -- claim 22--

Signed and Sealed this

Twenty-eighth Day of September, 1999

Attest:

Q. TODD DICKINSON

*Attesting Officer*      *Acting Commissioner of Patents and Trademarks*